(12) United States Patent
Kotani et al.

(10) Patent No.: US 7,934,175 B2
(45) Date of Patent: Apr. 26, 2011

(54) PARAMETER ADJUSTMENT METHOD, SEMICONDUCTOR DEVICE MANUFACTURING METHOD, AND RECORDING MEDIUM

(75) Inventors: Toshiya Kotani, Tokyo (JP); Yasunobu Kai, Yokohama (JP); Soichi Inoue, Yokohama (JP); Satoshi Tanaka, Kawasaki (JP); Shigeki Nojima, Yokohama (JP); Kazuyuki Masukawa, Yokohama (JP); Koji Hashimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 371 days.

(21) Appl. No.: 12/062,859

(22) Filed: Apr. 4, 2008

(65) Prior Publication Data
US 2008/0250381 A1    Oct. 9, 2008

(30) Foreign Application Priority Data
Apr. 5, 2007   (JP) .................... 2007-099187

(51) Int. Cl.
*G06F 17/50*   (2006.01)
(52) U.S. Cl. ................ 716/54; 716/50; 716/52
(58) Field of Classification Search .............. 716/2, 3, 716/4, 19, 21, 50, 52, 54, 100, 102, 103
See application file for complete search history.

(56) References Cited

U.S. PATENT DOCUMENTS

| | | | | |
|---|---|---|---|---|
| 6,711,452 | B1 * | 3/2004 | Ogawa ...................... | 700/121 |
| 7,242,459 | B2 | 7/2007 | Shi et al. | |
| 7,266,800 | B2 * | 9/2007 | Sezginer ..................... | 716/52 |
| 7,685,543 | B2 * | 3/2010 | Tsuji et al. .................. | 716/106 |
| 2003/0139833 | A1 * | 7/2003 | Pierrat et al. ................ | 700/97 |
| 2005/0004774 | A1 * | 1/2005 | Volk et al. ................... | 702/108 |
| 2005/0273753 | A1 * | 12/2005 | Sezginer ..................... | 716/21 |
| 2006/0068301 | A1 | 3/2006 | Hirukawa | |
| 2007/0265725 | A1 * | 11/2007 | Liu et al. ..................... | 700/121 |

FOREIGN PATENT DOCUMENTS

| | | |
|---|---|---|
| JP | 2006-229042 | 8/2006 |
| JP | 2007-059906 | 3/2007 |

OTHER PUBLICATIONS

Notification of Reasons for Rejection mailed by the Japanese Patent Office on Jul. 31, 2009, for Japanese Patent Application No. 2007-099187, and English-language translation thereof.

* cited by examiner

*Primary Examiner* — Sun J Lin
(74) *Attorney, Agent, or Firm* — Finnegan, Henderson, Farabow, Garrett & Dunner, L.L.P.

(57) ABSTRACT

A parameter adjustment method for a plurality of manufacturing devices to form a pattern of a semiconductor device on a substrate using the manufacturing devices includes: adjusting a parameter adjustable for a manufacturing device serving as a reference manufacturing device; obtaining a first shape of a pattern of a semiconductor device to be formed on a substrate; defining an adjustable parameter of another to-be-adjusted manufacturing; obtaining a second shape of the pattern formed on the substrate; calculating a difference amount between a reference finished shape and a to-be-adjusted finished shape; repeatedly calculating the difference amount by changing the to-be-adjusted parameter until the difference amount becomes equal to or less than a predetermined reference value; and outputting as a parameter of the to-be-adjusted manufacturing device the to-be-adjusted parameter.

20 Claims, 10 Drawing Sheets

PARAMETER ADJUSTMENT METHOD, SEMICONDUCTOR DEVICE MANUFACTURING METHOD, AND RECORDING MEDIUM

CROSS REFERENCE TO RELATED APPLICATION

This application is based upon and claims the benefit of priority from the prior Japanese Patent Application No. 2007-099187, filed on Apr. 5, 2007, the entire contents of which are incorporated herein by reference.

BACKGROUND OF THE INVENTION

1. Field of the Invention

The present invention relates to a parameter adjustment method, a semiconductor device manufacturing method, and a computer-readable recording medium.

2. Related Background Art

In recent years, semiconductor manufacturing technology has made a remarkable progress, and semiconductors with a minimum processing size of 90 nm have been mass-produced. Such a microfabrication has been achieved by an astonishing progress in fine patterning technology such as mask process technology, lithography process technology, and etching process technology. In order to follow the recent sharp drop in market price, it is needed to lower costs quickly, and it is very important to use a technique for mass-producing products early and stably.

In order to achieve mass-production, stable manufacturing is required by a plurality of manufacturing devices. However, when a process margin is reduced with a progress in microfabrication, a problem occurs in that the difference in performance variation between manufacturing devices affects yield. In order to maintain stable and high yield, it is important to minimize the difference in performance between a chip manufactured by a manufacturing device serving as a reference and a chip manufactured by another manufacturing device. The above problem will be described in detail with reference to an exposure device.

For example, if a problem occurs in a different exposure device, it is conventionally difficult to provide a guideline on how to set parameters and their adjusted values for the exposure device. The difficulty lies in the following circumstances:

1) The exposure device has a limited number of adjustable parameters affecting size variation on a wafer (light shape and aberration only);
2) No fine parameter adjustment is required because the process margin is relatively large;
3) Relatively uniform distribution of diffracted light with respect to lens allows for a small size variation on a wafer due to an aberration control of a light and lens; and the like.

In view of the above, the parameters for the manufacturing device are optimized based on the experience of a technician to provide a stable manufacturing.

However, with the recent progress in microfabrication, the following circumstances are observed:

a) Minute changes in parameter of the exposure device that are not conventionally considered (e.g., degree of polarization of an exposure light, flare, NA (numerical aperture), synchronization accuracy of the exposure device, and the like) are beginning to affect the finished shape on a wafer;
b) Customized light shape is required to cope with the microfabrication, and thus the effect of minute variations of the light shape on the size on a wafer is increasing relatively;
c) When a specific fine pattern is formed using the above light b), the diffracted light passing through the lens is focused on a specific position. As a result, the effect of the lens performance at a specific position (aberration and light transmission of the lens) on the size on a wafer is increasing relatively.

Under such circumstances, the specification of each exposure device parameter needs to be tightened. However, it is very difficult to satisfy every specification. Accordingly, what is required is a technique for quantitatively estimating the effect of a variation of an exposure device parameter on a finished shape on a wafer to perform a proper and rigorous adjustment on a large number of exposure device parameters.

SUMMARY OF THE INVENTION

According to a first aspect of the present invention, there is provided a parameter adjustment method for a plurality of manufacturing devices to form a pattern of a semiconductor device on a substrate using the manufacturing devices, the parameter adjustment method comprising:

adjusting a parameter adjustable for a manufacturing device serving as a reference manufacturing device so as to fall within a range of a predetermined permissible variation and defining the adjusted parameter as a reference parameter of the reference manufacturing device;

obtaining a first shape of a pattern of a semiconductor device to be formed on a substrate using the reference manufacturing device from a mask to form the pattern on the substrate when the reference parameter is set to the reference manufacturing device and defining the obtained first shape as a reference finished shape;

defining an adjustable parameter of another to-be-adjusted manufacturing device as a to-be-adjusted parameter of the to-be-adjusted manufacturing device;

obtaining a second shape of the pattern formed on the substrate using the to-be-adjusted manufacturing device from the mask when the defined to-be-adjusted parameter is set to the to-be-adjusted manufacturing device and defining the obtained second shape as a to-be-adjusted finished shape;

calculating a difference amount between the reference finished shape and the to-be-adjusted finished shape;

repeatedly calculating the difference amount by changing the to-be-adjusted parameter until the difference amount becomes equal to or less than a predetermined reference value;

outputting as a parameter of the to-be-adjusted manufacturing device the to-be-adjusted parameter having the difference amount equal to or less than the predetermined reference value or the to-be-adjusted parameter having the difference amount which becomes equal to or less than the predetermined reference value through the repeated calculation.

According to a second aspect of the present invention, there is provided a semiconductor device manufacturing method using a plurality of manufacturing devices to which parameters adjusted by a parameter adjustment method are set, the parameter adjustment method comprising:

adjusting a parameter adjustable for a manufacturing device serving as a reference manufacturing device so as to fall within a range of a predetermined permissible variation and defining the adjusted parameter as a reference parameter of the reference manufacturing device;

obtaining a first shape of a pattern of a semiconductor device to be formed on a substrate using the reference manufacturing device from a mask to form the pattern on the substrate when the reference parameter is set to the reference manufacturing device and defining the obtained first shape as a reference finished shape;

defining an adjustable parameter of another to-be-adjusted manufacturing device as a to-be-adjusted parameter of the to-be-adjusted manufacturing device;

obtaining a second shape of the pattern formed on the substrate using the to-be-adjusted manufacturing device from the mask when the defined to-be-adjusted parameter is set to the to-be-adjusted manufacturing device and defining the obtained second shape as a to-be-adjusted finished shape;

calculating a difference amount between the reference finished shape and the to-be-adjusted finished shape;

repeatedly calculating the difference amount by changing the to-be-adjusted parameter until the difference amount becomes equal to or less than a predetermined reference value;

outputting as a parameter of the to-be-adjusted manufacturing device the to-be-adjusted parameter having the difference amount equal to or less than the predetermined reference value or the to-be-adjusted parameter having the difference amount which becomes equal to or less than the predetermined reference value through the repeated calculation.

According to a third aspect of the present invention, there is provided a computer-readable recording medium in which a program is recorded to cause a computer to execute a parameter adjustment method for a plurality of manufacturing devices to form a pattern of a semiconductor device on a substrate using the manufacturing devices, the parameter adjustment method comprising:

adjusting a parameter adjustable for a manufacturing device serving as a reference manufacturing device so as to fall within a range of a predetermined permissible variation and defining the adjusted parameter as a reference parameter of the reference manufacturing device;

obtaining a first shape of a pattern of a semiconductor device to be formed on a substrate using the reference manufacturing device from a mask to form the pattern on the substrate when the reference parameter is set to the reference manufacturing device and defining the obtained first shape as a reference finished shape;

defining an adjustable parameter of another to-be-adjusted manufacturing device as a to-be-adjusted parameter of the to-be-adjusted manufacturing device;

obtaining a second shape of the pattern formed on the substrate using the to-be-adjusted manufacturing device from the mask when the defined to-be-adjusted parameter is set to the to-be-adjusted manufacturing device and defining the obtained second shape as a to-be-adjusted finished shape;

calculating a difference amount between the reference finished shape and the to-be-adjusted finished shape;

repeatedly calculating the difference amount by changing the to-be-adjusted parameter until the difference amount becomes equal to or less than a predetermined reference value;

outputting as a parameter of the to-be-adjusted manufacturing device the to-be-adjusted parameter having the difference amount equal to or less than the predetermined reference value or the to-be-adjusted parameter having the difference amount which becomes equal to or less than the predetermined reference value through the repeated calculation.

BRIEF DESCRIPTION OF THE DRAWINGS

With reference to the accompanying drawing.

DETAILED DESCRIPTION OF THE INVENTION (1) Embodiment

Hereinafter, an embodiment of the present invention will be described with reference to drawings.

Figure 1:
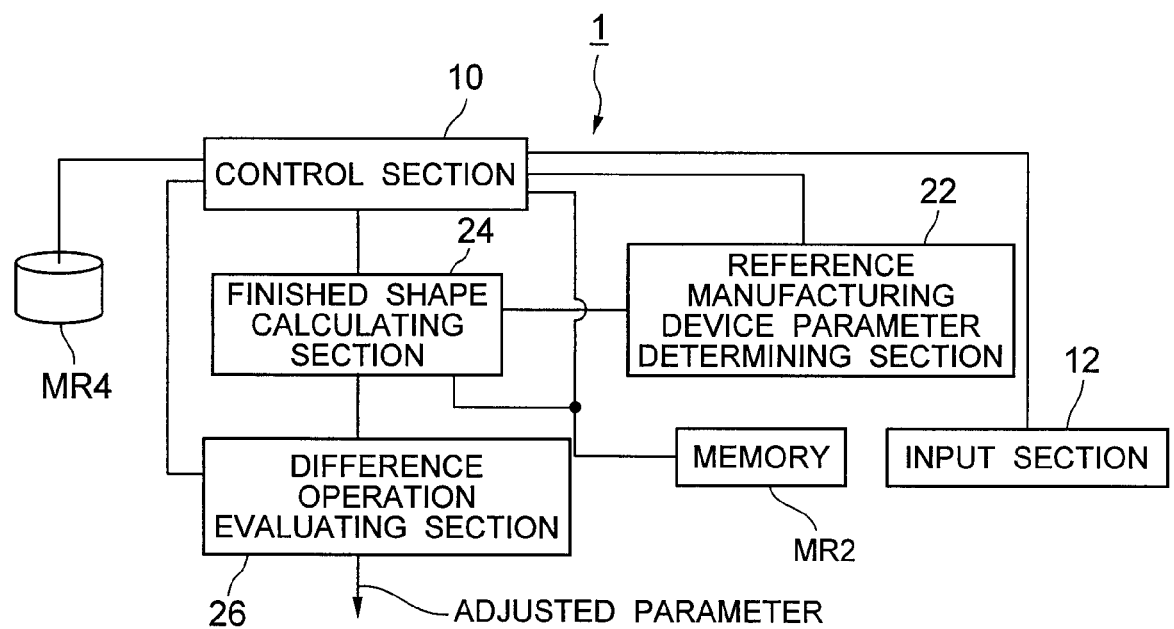
FIG. 1 is a block diagram showing a schematic configuration of a parameter adjusting device in accordance with an embodiment of the present invention.

FIG. 1 is a block diagram showing a schematic configuration of a parameter adjusting device in accordance with an embodiment of the present invention. A parameter adjusting device 1 shown in FIG. 1 includes a control section 10, an input section 12, a memory MR2, a reference manufacturing device parameter determining section 22, a finished shape calculating section 24, and a difference operation evaluating section 26.

The control section 10 is connected to the input section 12, the memory MR2, the reference manufacturing device parameter determining section 22, the finished shape calculating section 24, and the difference operation evaluating section 26 to control these constituent elements. The control section 10 is also connected to an external recording device MR4 in which a recipe file is stored. The control section 10 reads the recipe file from the recording device MR4 and performs parameter adjustment according to the recipe. It should be noted that the recording device MR4 is not limited to an external device, but may be a hard disk drive or the like installed in the parameter adjusting device 1, which reads the recipe file on an as-needed basis.

The memory MR2 has not only a storage area for storing information about various adjustable parameters, but also a storage area for storing a reference value for difference operation by the difference operation evaluating section 26 and a storage area for temporarily storing the operation result by the difference operation evaluating section 26.

The input section 12 is also connected to the reference manufacturing device parameter determining section 22 and the finished shape calculating section 24. The input section 12 supplies the information about the reference manufacturing device selected by an operator to the reference manufacturing device parameter determining section 22 and supplies the information about the adjustable parameter extracted by the operator to the finished shape calculating section 24.

The reference manufacturing device parameter determining section 22 adjusts an adjustable parameter of a manufacturing device serving as reference to parameter adjustment (hereinafter referred to as a reference manufacturing device) so as to fall within a range of a predetermined permissible variation, and determines the adjusted parameter as the reference parameter PMr of the reference manufacturing device.

The finished shape calculating section 24 is also connected to the reference manufacturing device parameter determining section 22. The finished shape calculating section 24 calculates the finished shape on a wafer for both the reference manufacturing device and a to-be-adjusted manufacturing device other than the reference manufacturing device (hereinafter referred to as a to-be-adjusted manufacturing device) by simulating the mask pattern for the photo mask using an adjustable pattern. Here, a finished shape calculated about the reference manufacturing device is defined as the reference finished shape FSr, and a finished shape calculated about a to-be-adjusted manufacturing device other than the reference manufacturing device is defined as a to-be-adjusted finished shape FSn.

The difference operation evaluating section 26 is connected to the finished shape calculating section 24. The difference operation evaluating section 26 calculates the difference amount between the reference finished shape FSr and the to-be-adjusted finished shape FSn and compares the difference amount with a predetermined reference value. If the difference amount exceeds the predetermined reference value, the difference operation evaluating section 26 changes the to-be-adjusted parameter PMn and recalculates the difference amount to compare it with the predetermined reference value. The difference operation evaluating section 26 repeats this process until the above difference amount is equal to or less than the predetermined reference value. When the above difference amount is equal to or less than the predetermined reference value or when the result of a repeated operation is equal to or less than the predetermined reference value, the difference operation evaluating section 26 outputs the to-be-adjusted parameter as the parameter of the to-be-adjusted manufacturing device.

Hereinafter, with reference to the flowcharts shown in FIGS. 2 and 3, the method of adjusting a parameter for a manufacturing device using the parameter adjusting device 1 shown in FIG. 1 will be described. In the following description, the number of manufacturing devices (including the reference manufacturing device) is n+1 (n is a natural number).

Figure 2:
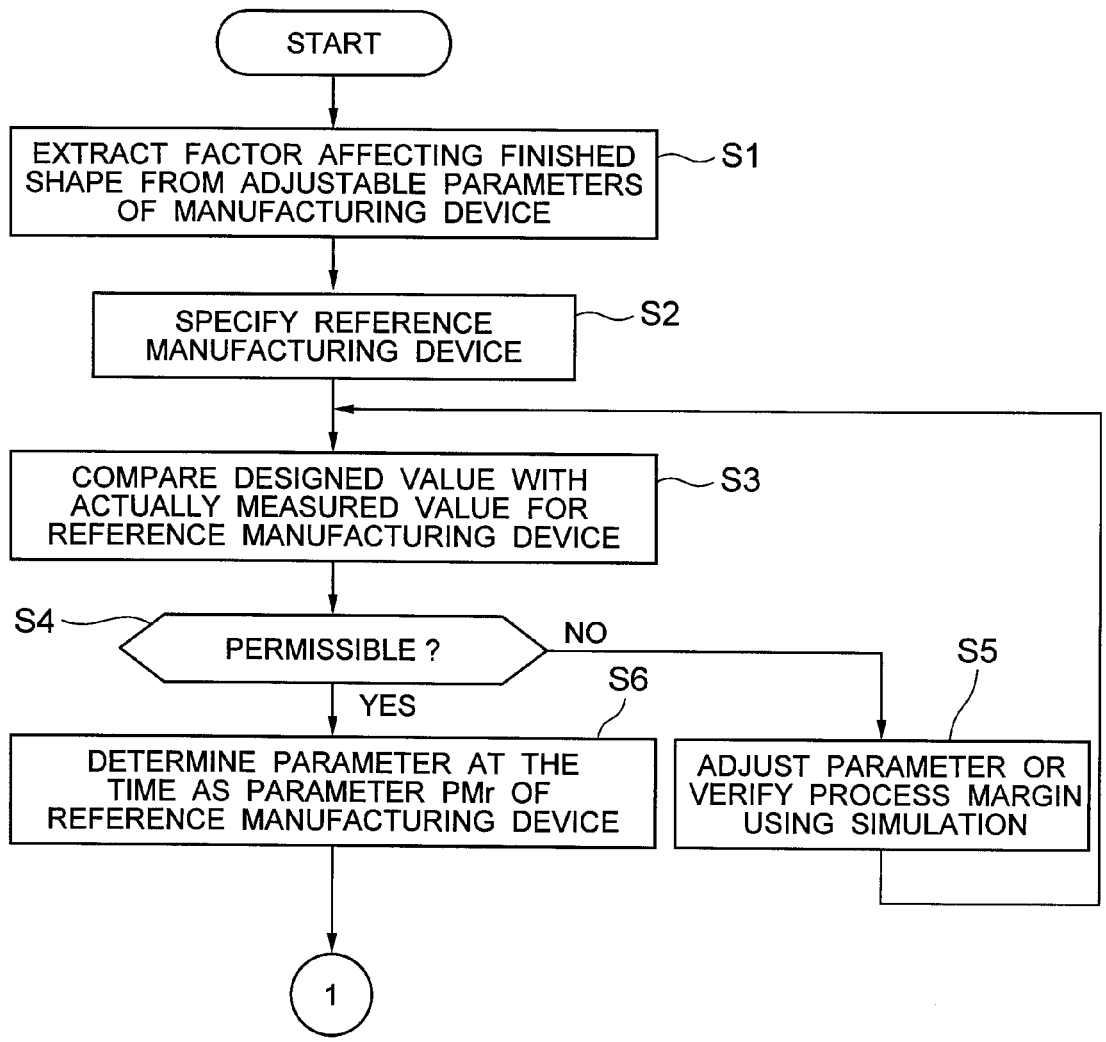
FIGS. 2 and 3 are flowcharts each showing a schematic procedure for the parameter adjustment method in accordance with an embodiment of the present invention.
Figure 3:
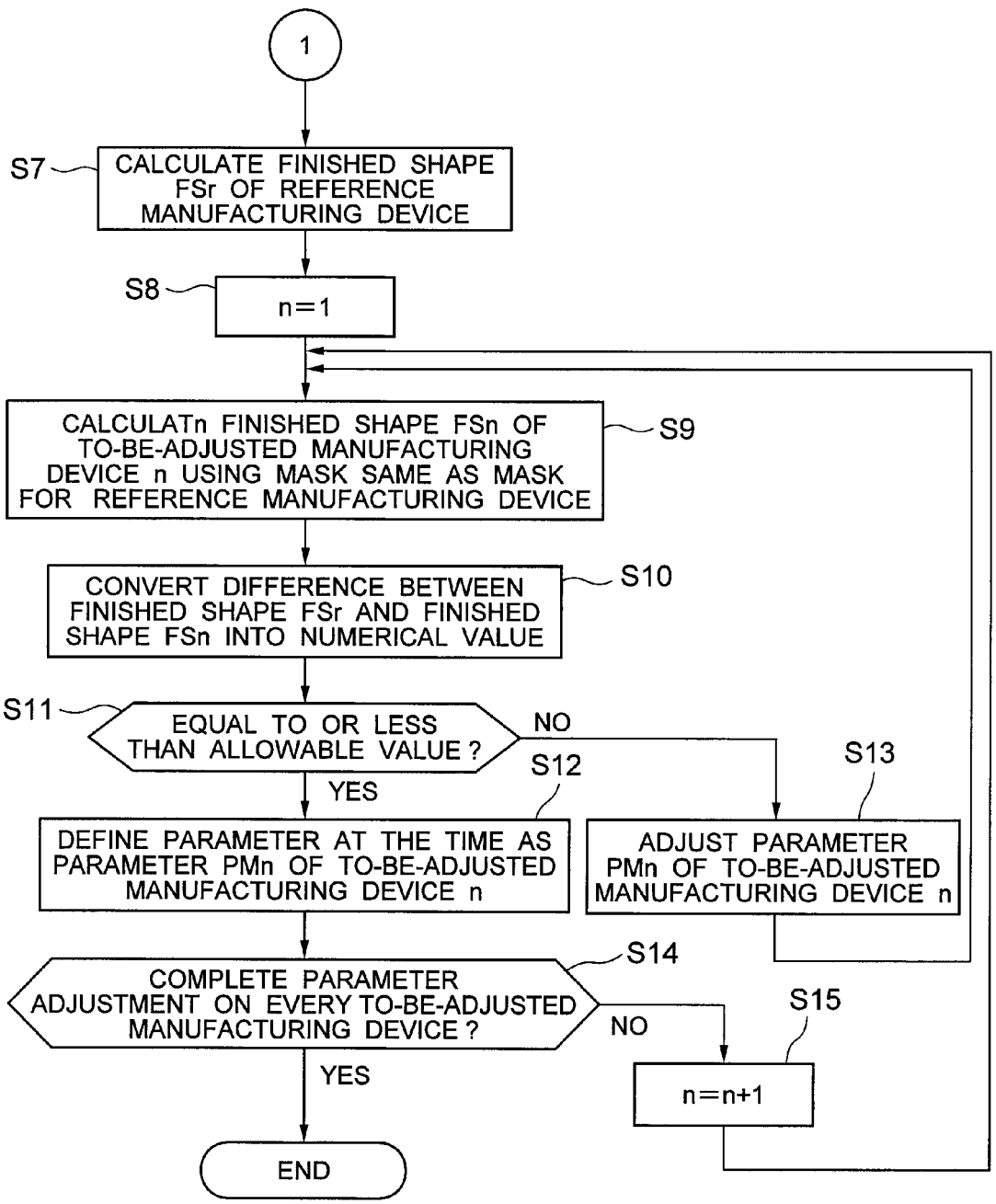

First, as shown in FIG. 2, an operator extracts a factor affecting a finished shape on a wafer from among adjustable parameters of a manufacturing device, and enters the corresponding parameter in the input section 12 (step S1). Examples of the adjustable parameters include a light shape, an NA (numerical aperture), an aberration, a flare, a degree of polarization, a chromatic aberration, a scan, and a telecentric deflection (light luminance distribution). Alternatively, a variation of a flow rate, a temperature, a refractive index, and a permeability of the medium of an exposure device using a liquid immersion method may be considered because the liquid immersion method has recently been popular to enhance the resolution of the exposure device.

Next, the operator specifies a reference manufacturing device from among the (n+1) manufacturing devices and enters the reference manufacturing device in the input section 12 (step S2). As a criterion of determining what manufacturing device should be selected as the reference manufacturing device, for example, the latest manufacturing device or a manufacturing device which is calibrated very well and has very low variation rate can be considered, but it is generally appropriate to select a manufacturing device which could manufacture a target product very well in the development stage.

Subsequently, the reference manufacturing device parameter determining section 22 compares a designed value of each parameter provided by a corresponding manufacturer with an actually measured value of each parameter actually obtained with respect to the reference manufacturing device (step S3). Next, an evaluation is made to determine whether each actually measured value falls within a range of a permissible variation for the designed value (step S4). If an actually measured value does not fall within the permissible variation, the parameter is adjusted so as to be within the permissible variation or verification is made whether to maintain enough process margins using each actually measured value for simulation (step S5). If a determination is made that the effect of the difference between the designed value and the actually measured value of a parameter on process margin reduction is smaller than a predetermined value, the difference between the designed value and the actually measured value can be permitted (steps S3 and S4). As a result, the parameter is determined as the parameter of the reference manufacturing device (step S6).

Hereinafter, a method of determining a parameter to apply the same photo mask to other n to-be-adjusted manufacturing devices which are different from the reference manufacturing device will be described with reference to FIG. 3.

First, the finished shape calculating section 24 uses the actual parameter PMr of the reference manufacturing device to simulate the photo mask and calculate a finished shape FSr on a wafer (step S7). This finished shape FSr may be calculated with an uncontrollable variation of the manufacturing device (e.g. a light exposure amount and a focus of the exposure device as well as a time-variable factor of parameters PMr) taken into consideration.

Next, the finished shape calculating section 24 sets n=1 (step S8), and then uses the actual parameter PMn as the to-be-adjusted parameter of the to-be-adjusted manufacturing device n to simulate the mask pattern of the above photo mask and calculate a finished shape FSn on a wafer (step S9). At this time, the reference parameter PMr is different from the to-be-adjusted parameter PMn, and thus the finished shape FSr is different from the finished shape FSn.

Next, the difference operation evaluating section 26 converts the difference between the finished shape FSr and the finished shape FSn into a numerical value (step S10). Examples of the numerical conversion includes a method in which an area of difference between the finished shape FSr and the finished shape FSn is used as a measure of difference to calculate the sum of the areas and use that number; and a method in which a portion whose difference amount is greater than a predetermined threshold is extracted and the number of portions is used as a measure of difference to calculate the sum of the portions and use that number.

Subsequently, the difference operation evaluating section 26 compares the calculated difference with a predetermined allowable value (step S11). If the difference is equal to or less than the predetermined allowable value, the actual parameter PMn at the time is defined as the parameter for to-be-adjusted manufacturing device n. On the other hand, if the difference exceeds the predetermined allowable value, the difference operation evaluating section 26 adjusts the to-be-adjusted parameter PMn (step S13). Here, the to-be-adjusted parameter PMn is composed of various factors, and thus it is preferable to optimize each factor of the to-be-adjusted parameter PMn by an optimization algorithm using as a cost function the difference amount converted into a numerical value as described above. It should be noted that the adjustment range of the to-be-adjusted parameter PMn should be limited within a range of mechanical restriction of the manufacturing device. This is because even if an optimum parameter value is found, if the value exceeds the range of mechanical restriction, it is not actually possible to set the parameter to the manufacturing device n. Alternatively, before the optimization algorithm is used, an experimental design method may be used to predict a combination of each factor of a to-be-adjusted parameter PMn close to the optimum value, and use the value as an initial value to perform optimization.

Afterward, the steps from the aforementioned S9 to S13 are performed on every to-be-adjusted manufacturing device (steps S14 and S15).

As described above, according to the present embodiment, it is possible to automatically determine the value n of a parameter capable of obtaining the finished shape FSn which minimizes the difference to the finished shape FSr of the reference manufacturing device. This allows an early, stable mass-production to be provided.

According to the present embodiment, an actually measured value is used as a reference parameter PMr and a to-be-adjusted parameter PMn, but the present invention is not limited to the actually measured value. For example, if a relative difference exists between a set value to the manufacturing device and an actually measured value, the set value of the manufacturing device may be used instead of the actually measured value by taking the difference into consideration. In other words, if it is possible to obtain the same lithographic characteristics as the actually measured value by taking an offset amount to the designed value into consideration, it is also possible to determine the parameter value by taking the offset amount into consideration.

Furthermore, if the designed value itself is different because the manufacturer is different, it is necessary to design so that the designed value of a parameter of the manufacturing device may have the same lithographic characteristics as the reference parameter PMr of the reference manufacturing device. The subsequent procedure is substantially the same as the aforementioned flow. The parameter PMn of the to-be-adjusted manufacturing device is determined so as to minimize the difference to the finished shape FSr of the reference manufacturing device.

(2) EXAMPLES

1) Example 1

An example of applying the aforementioned embodiment to the two exposure devices A and B will be described.

The exposure device A is used as the reference exposure device, and an actual light shape and an NA (numerical aperture) of the exposure device A are also used to perform lithography simulation to calculate a planar shape FSr on a wafer. Then, the simulation was performed on the exposure device B which was different from the exposure device A under conditions of light shapes ($\sigma$ and $\epsilon$) and a numerical aperture (NA) to calculate a planar shape FS1 on a wafer. Subsequently, the difference between the planar shape FSr and the planar shape FS1 was obtained, and the sum of the differences was used as a cost function. Further, the values $\sigma$, $\epsilon$ and NA minimizing the cost function were determined. At this time, an optimization algorithm capable of simultaneously optimizing a plurality of parameters was used.

Figure 4:
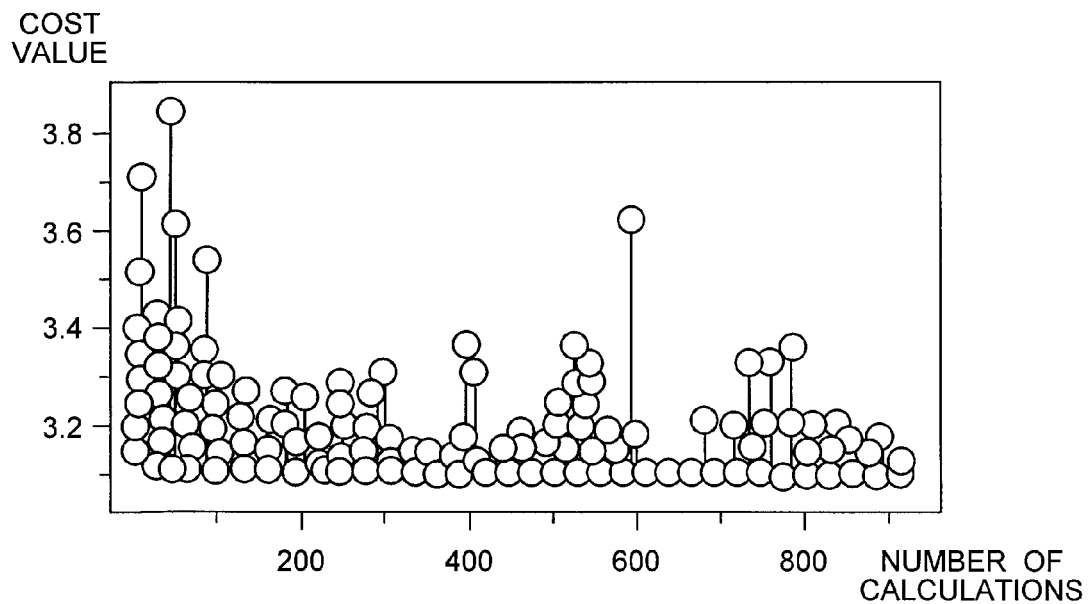
FIG. 4 is a graph showing a relation between the number of calculations and a cost function value in accordance with an embodiment of the present invention.
Figure 5:
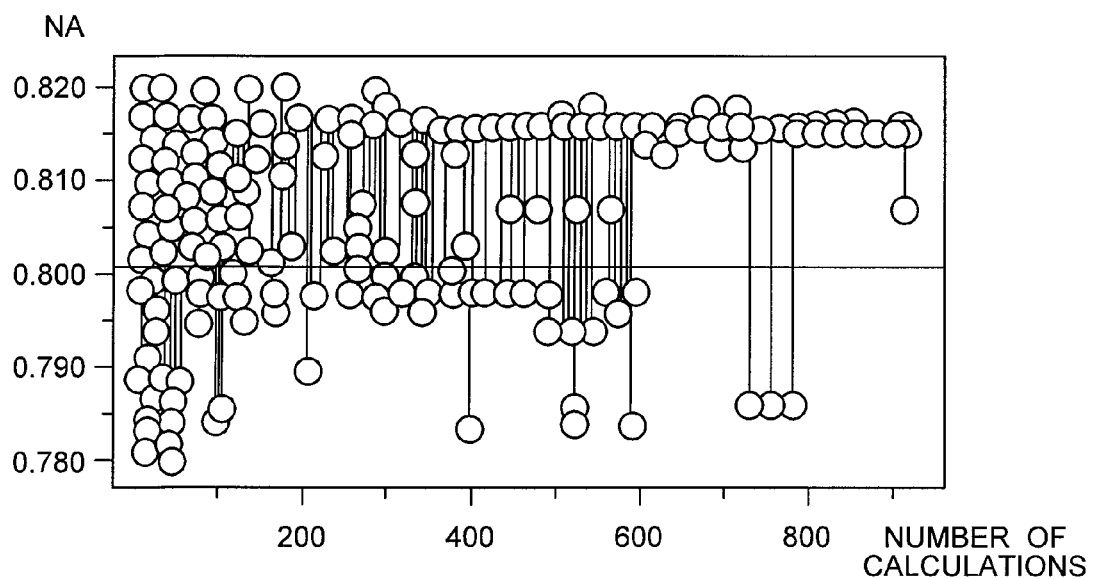
FIG. 5 is a graph showing a relation between the number of calculations and a value NA in accordance with an embodiment shown in FIG. 4.
Figure 6:
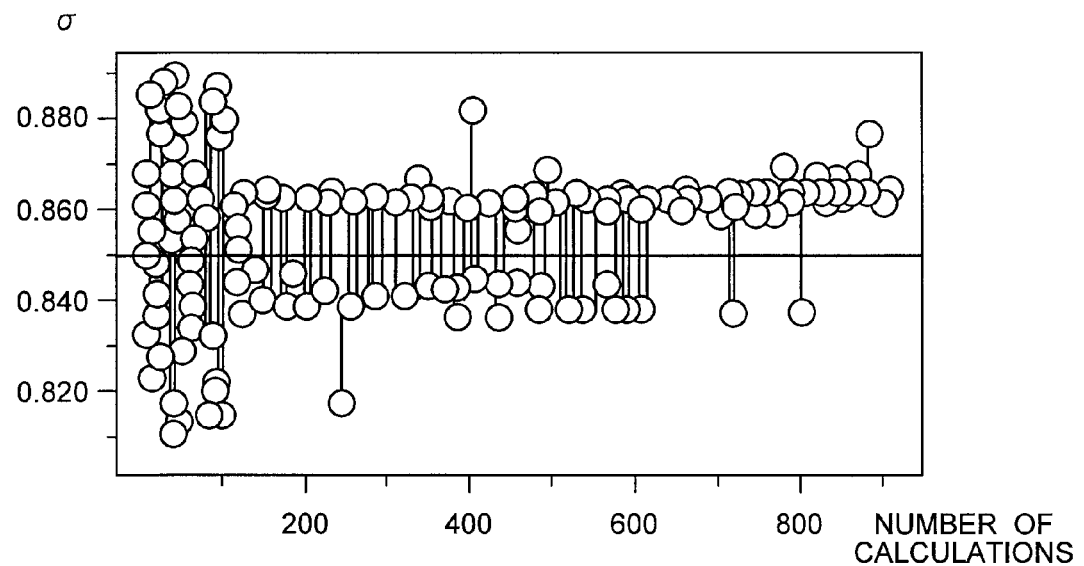
FIG. 6 is a graph showing a relation between the number of calculations and a value σ in accordance with an embodiment shown in FIG. 4.
Figure 7:
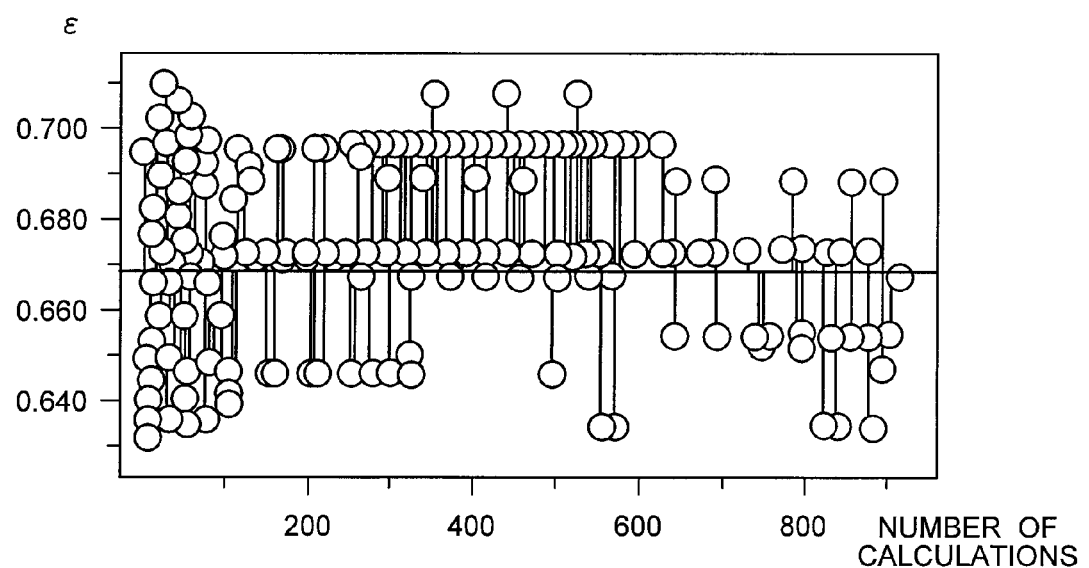
FIG. 7 is a graph showing a relation between the number of calculations and a value ε in accordance with an embodiment shown in FIG. 4.

As the optimization algorithm, a general optimization method such as a simplex method, a simulated annealing method, and a genetic algorithm was used. Furthermore, before these algorithms are used, an experimental design method is used to calculate an initial value in the vicinity of an optimum value of the parameter and then the initial value may be used for the optimization algorithm. FIG. 4 is a graph plotting the number of calculations on the horizontal axis and cost function values on the vertical axis. From FIG. 4, it is understood that the more the number of calculations, the smaller the cost function value. The initial values start with NA=0.80, $\sigma$=0.85, and $\epsilon$=0.67, and each of the minimum cost function values are 0.815, 0.859, and 0.674. The values NA, $\sigma$ and $\epsilon$ corresponding to the number of calculations are shown in FIGS. 5, 6, and 7 respectively.

2) Example 2

The following description focuses on the degree of polarization of an exposure light used as an adjustable parameter, and an example of minimizing the difference between the reference finished shape and the to-be-adjusted finished shape by changing the degree of polarization according to the pattern density. As the examples of a pattern, a line & space pattern and a hole pattern will be described in that sequence.

Figure 8:
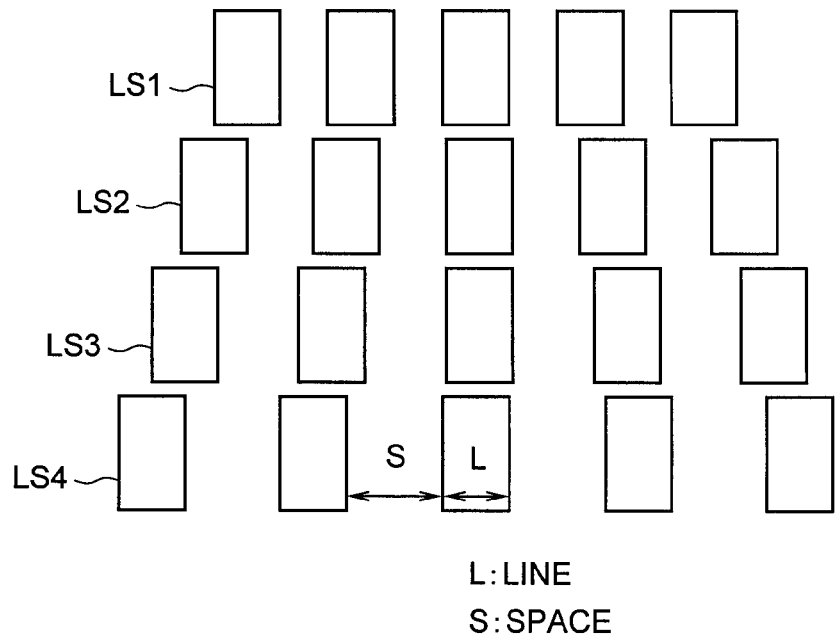
FIG. 8 is a schematic drawing showing an example of a mask pattern having a line & space pattern.
Figure 9:
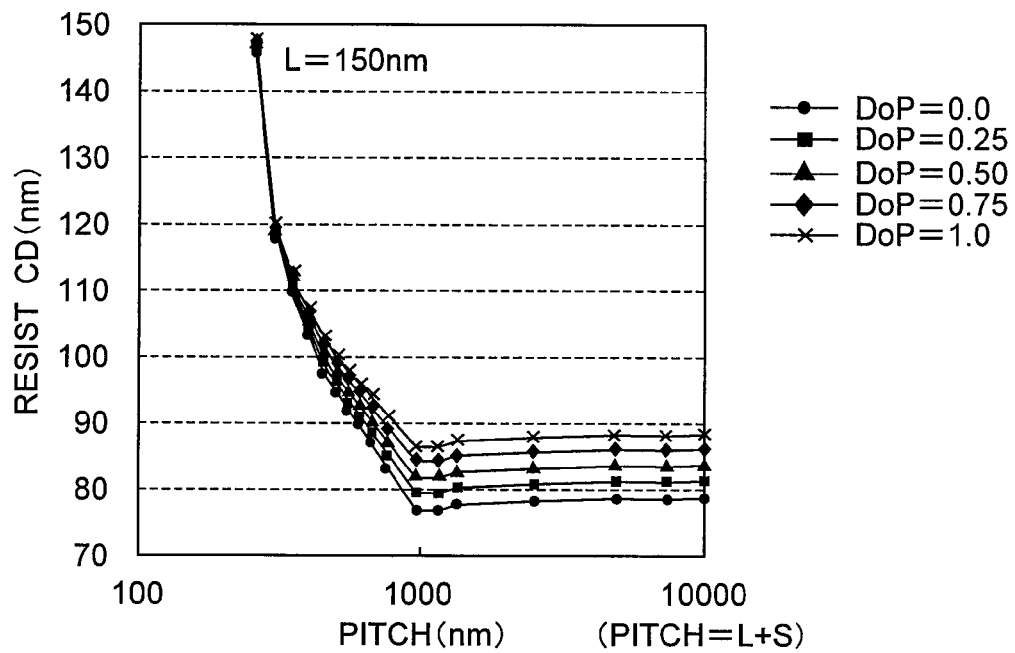
FIGS. 9 to 11 each shows an OPE curve simulating the relation between a pitch and a resist size of the mask pattern shown in FIG. 8.
Figure 10:
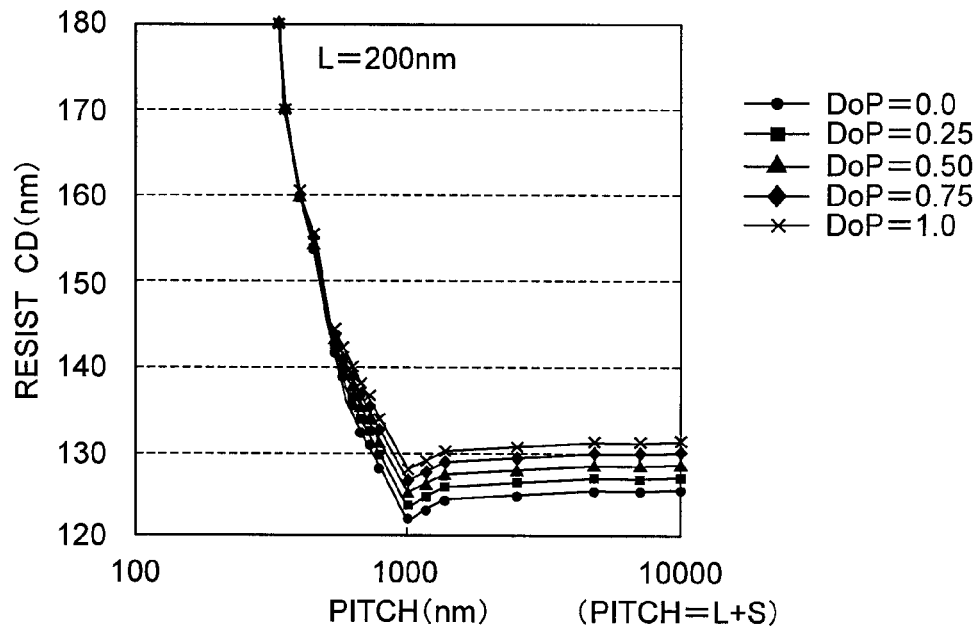
Figure 11:
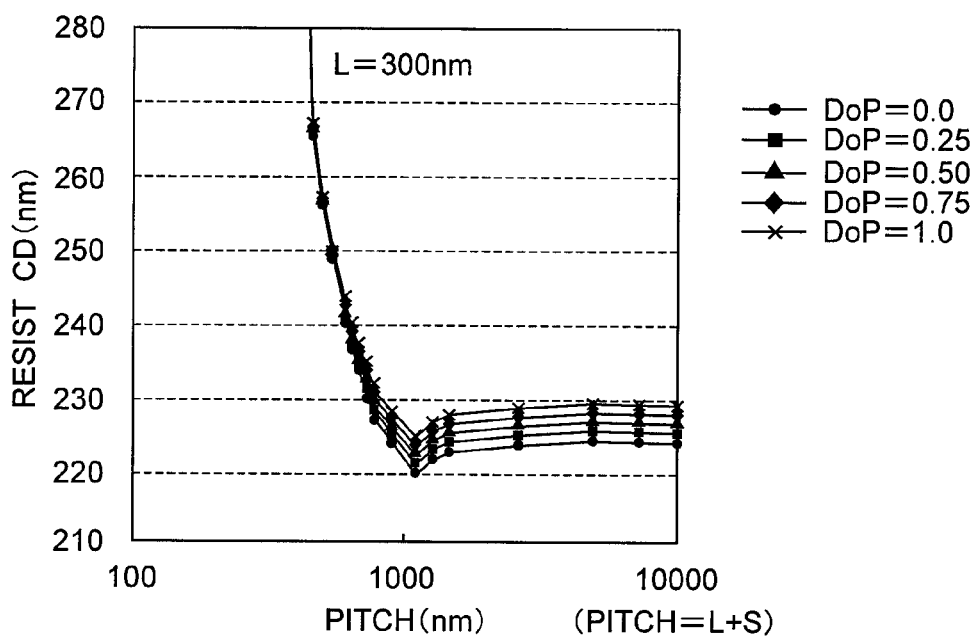

FIG. 8 is a schematic drawing showing an example of a mask pattern having line & space patterns LS1 to LS4 in which the line size is fixed and the pitch between lines is increased gradually. The resist size transcribed on a wafer is changed by the optical proximity effect (OPE) which depends on the pitch. FIGS. 9 to 11 show OPE curves simulating the relation between the pitch and the resist size with respect to a mask pattern having a line & space pattern with the same line width by changing the degree of polarization of a light. For these simulations, each line width of a pattern is 150 nm, 200 nm, and 300 nm, and the values 0.0, 0.25, 0.50, 0.75, and 1.0 were selected as the degree of polarization (DoP) of the exposure light for each. As the line & space pattern, a pattern configuring a 43 nm NAND cell array portion was selected. From the OPE curves shown in FIGS. 9 to 11, it is understood that a maximum of 10 nm of an OPE curve can be adjusted by adjusting the degree of polarization.

The present embodiment will be further specifically described with reference to flowcharts shown in FIGS. 2 and 3.

First, an optical proximity effect is extracted as a factor affecting a finished shape (step S1). With respect to the reference manufacturing device (specified at step S2), the reference manufacturing device parameter determining section 22 compares a designed value of the degree of polarization provided by the manufacturer with an actually measured value of the degree of polarization which is actually obtained (step S3).

Then, an evaluation is made to determine whether the above actually measured value falls within a predetermined permissible value (step S4). If an actually measured value does not fall within the permissible value, the degree of polarization is adjusted so as to be within the permissible variation or verification is made whether to maintain enough process margins using each actually measured value for lithography simulation (step S5). As a result, if a determination is made that the effect of the difference in degree of polarization between the design and the actual measurement on process margin reduction is smaller than a predetermined value, the difference between the designed value and the actually measured value can be permitted (steps S3 and S4), and thus the degree of polarization is determined as the degree of polarization of the reference manufacturing device (step S6).

Figure 12:
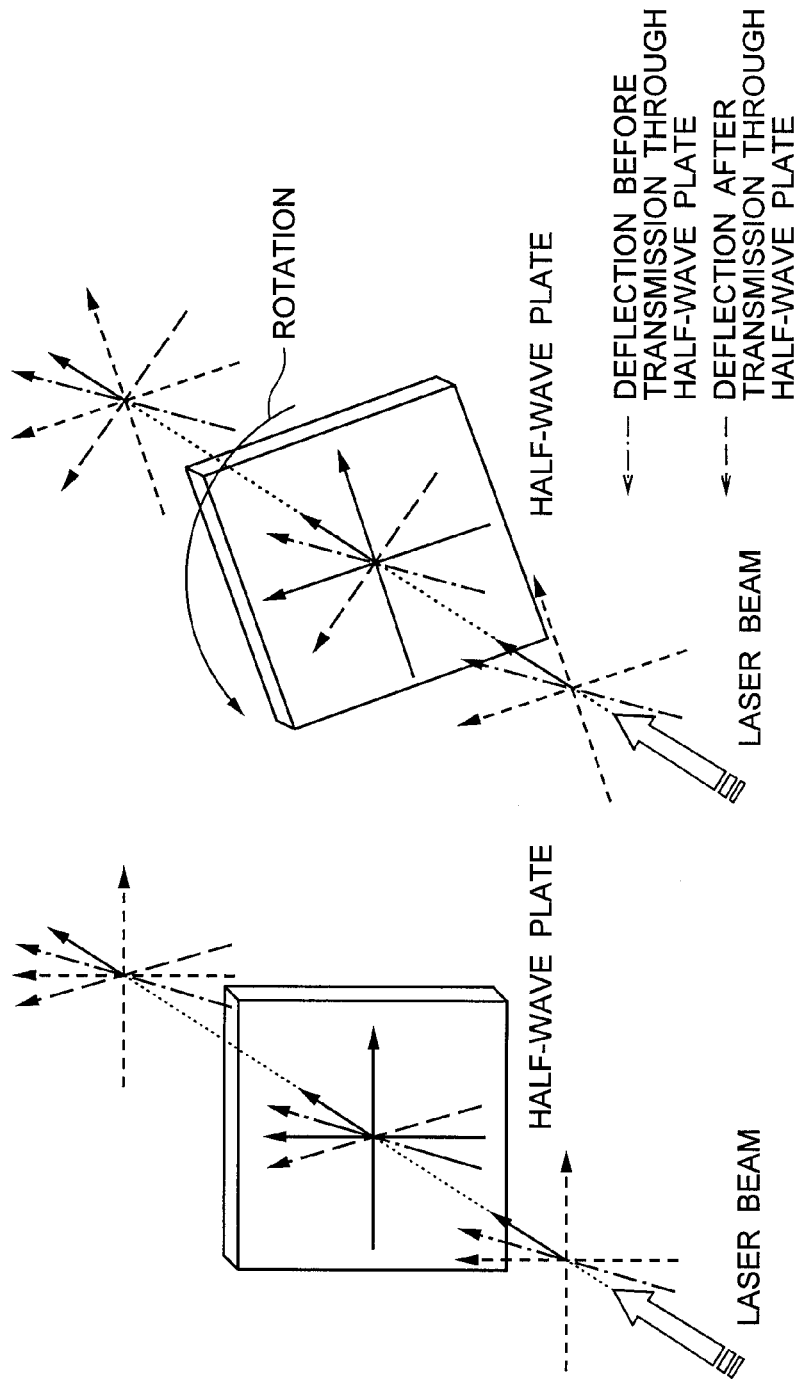
FIGS. 12A and 12B are drawings explaining a specific method of adjusting a degree of polarization of an exposure light.

In order to adjust the degree of polarization of the exposure light, for example, a half-wave plate is disposed in a position immediately after the laser beam is emitted from the light source as shown in FIG. 12A. Further, as shown in FIG. 12B, it is also possible to adjust the degree of polarization by rotating the same half-wave plate around the direction of the laser beam.

Next, the finished shape calculating section 24 uses an actually measured degree of polarization (hereinafter referred to as reference degree of polarization PDr) of the reference manufacturing device to simulate the photo mask and calculate a finished shape FSr on a wafer (step S7).

Subsequently, the finished shape calculating section 24 sets n=1 (step S8), and then uses the actually measured degree of polarization (hereinafter referred to as a to-be-adjusted degree of polarization PDn) as the to-be-adjusted parameter of the to-be-adjusted manufacturing device n to simulate the mask pattern of the above photo mask and calculate a finished shape FSn on a wafer (step S9). At this time, the reference degree of polarization PDr is different from the to-be-adjusted degree of polarization PDn, and thus the finished shape FSr is different from the finished shape FSn.

Next, the difference operation evaluating section 26 converts the difference between the finished shape FSr and the finished shape FSn into a numerical value (step S10), and then, compares the calculated difference with a predetermined allowable value (step S11). If the difference is equal to or less than the predetermined allowable value, the to-be-adjusted degree of polarization PDn at the time is defined as the to-be-adjusted manufacturing device n. On the other hand, if the difference exceeds the predetermined allowable value, the difference operation evaluating section 26 adjusts the to-be-adjusted degree of polarization PDn (step S13). It should be noted that the adjustment range of the to-be-adjusted degree of polarization PDn should be limited within a range of mechanical restriction of the manufacturing device.

Afterward, the steps from the aforementioned S9 to S13 are performed on every to-be-adjusted manufacturing device (steps S14 and S15).

Conventionally, it is customary to polarize the laser beam to the maximum to increase the resolution. According to the present embodiment, it is possible to reduce the difference in optical proximity effect between the manufacturing devices by adjusting the degree of polarization within a range allowing a margin. Further, according to the present embodiment, it is possible to automatically determine the value of a to-be-adjusted degree of polarization PDn capable of obtaining the finished shape FSn which minimizes the difference to the finished shape FSr of the reference manufacturing device. It should be noted that the above simulation is based on a sparse pattern, but for example, a memory device is based on the densest pattern. In this case, the degree of polarization is adjusted so as to minimize the difference between a desired size and a sparse area size, typically a peripheral circuit area.

For a one-dimensional pattern such as a line & space pattern, a pitch in one direction may be considered, but for example, for a two-dimensional pattern such as a hole pattern disposed in an array, the degree of density/sparsity may be different between the vertical direction and the horizontal direction. In this case, the degree of density/sparsity may be different depending on the direction, and thus the horizontal-to-vertical ratio of a hole diameter in a hole pattern may be changed. For such a two-dimensional pattern, it is possible to minimize the difference between the reference finished shape and the to-be-adjusted finished shape by changing the degree of polarization so as to bring the horizontal-to-vertical ratio of a hole diameter in closer to 1.

Figure 13:
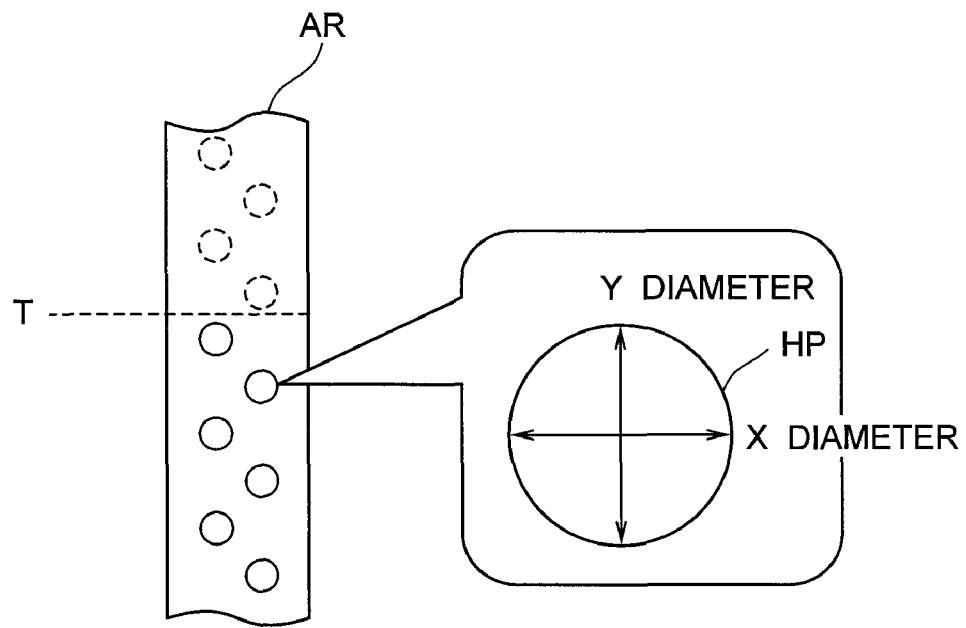
FIG. 13 is a schematic drawing showing an example of an edge adjacent region of a hole pattern array disposed cyclically.
Figure 14:
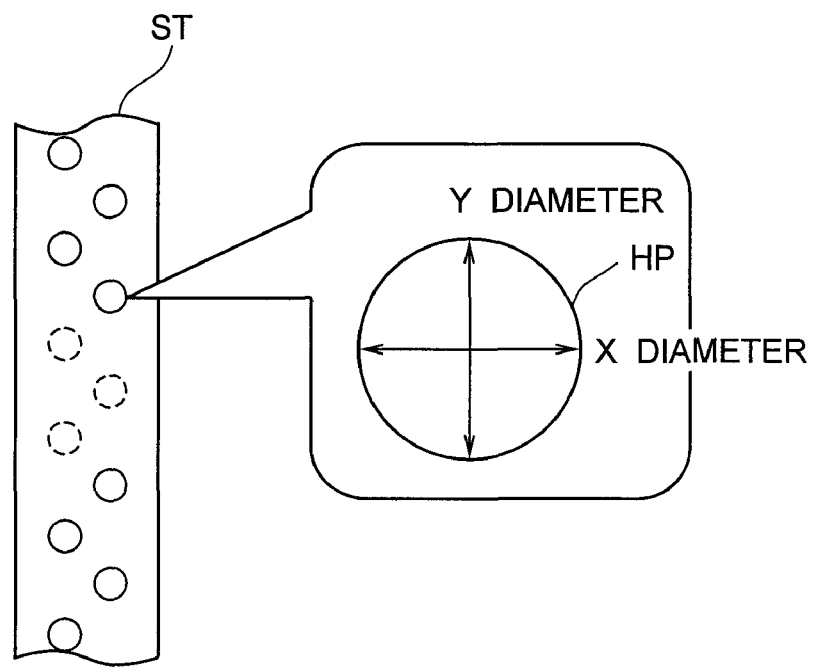
FIG. 14 is a schematic drawing showing an example of a region adjacent to a portion in which three hole patterns are missing of the hole pattern array cyclically disposed in a shunt portion.
Figure 15:
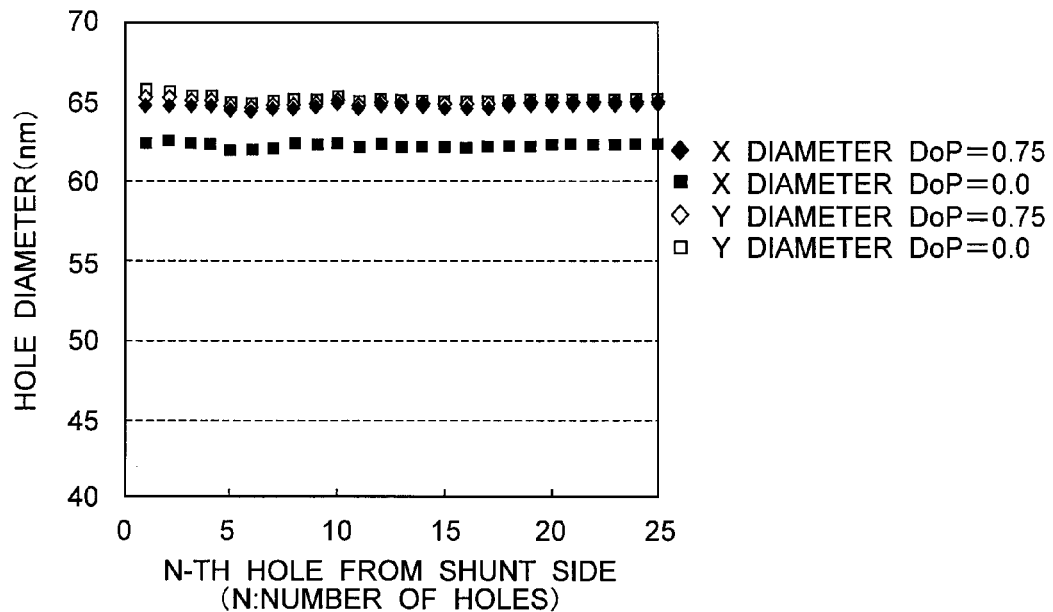
FIG. 15 shows OPE curves simulated from the pattern shown in FIG. 13.
Figure 16:
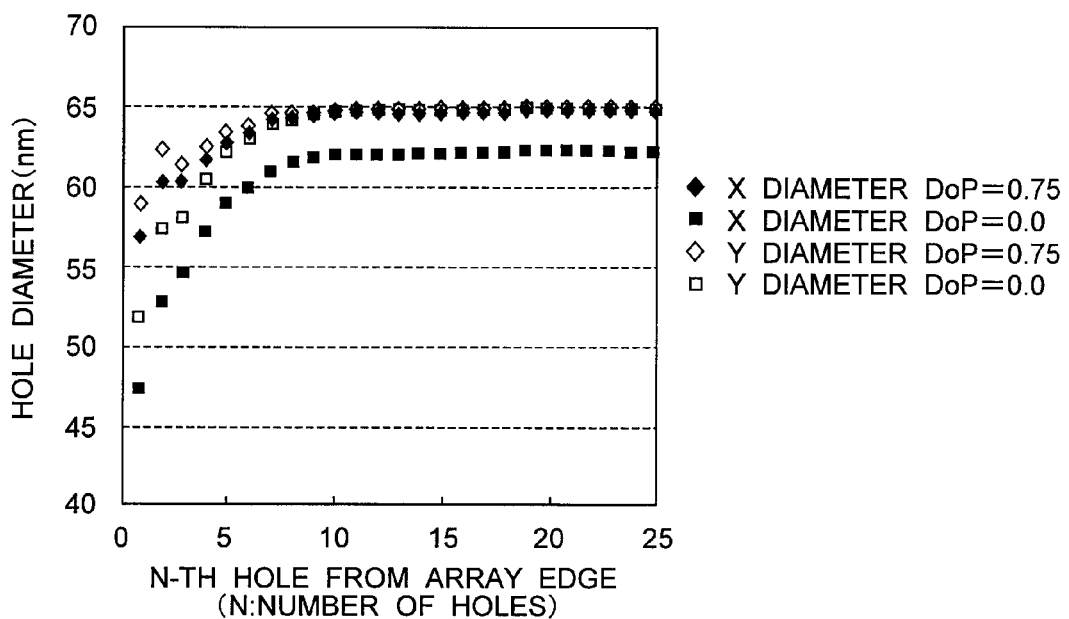
FIG. 16 shows OPE curves simulated from the pattern shown in FIG. 14.

More specifically, a hole pattern connecting upper and lower wiring layers of 43 nm NAND will be described in detail. FIG. 13 is a schematic drawing showing an example of an edge adjacent region of a hole pattern array AR disposed cyclically. In FIG. 13, disposition of a hole pattern HP terminates at a terminating portion T. In addition, FIG. 14 is a schematic drawing showing an example of a region adjacent to a portion in which three hole patterns are missing in a shunt portion ST in the middle of cyclically disposed hole patterns HP. FIGS. 15 and 16 each shows OPE curves simulated with an Y-direction hole diameter as the exposure light reference from the pattern shown in FIG. 13. For these simulations, 0.0 and 0.75 were selected as the degree of polarization of the exposure light. From the OPE curves shown in FIGS. 15 and 16, it is understood that a maximum of 5 nm can be adjusted for a hole with a designed diameter of 65 nm. In addition, from the OPE curves shown in FIG. 16, it is understood that the ratio between a hole diameter in the Y direction (direction of cyclically disposing a hole pattern in FIG. 13) and a hole diameter in the X direction orthogonal to the Y direction changes depending on the degree of polarization. Accordingly, for example, in the case of FIG. 16, it is possible to make the ratio between the X direction and the Y direction closer to 1 by changing the degree of polarization from 0.0 to 0.75.

The specific procedure for the hole pattern regarding the method of adjusting parameters between manufacturing devices is substantially the same as the procedure for the line & space pattern described above, and thus, the ratio between the X direction and the Y direction may be considered to calculate the finished shapes FSr and FSn.

(3) Semiconductor Device Manufacturing Method

When a semiconductor device is manufactured by the parameter adjustment method in accordance with the aforementioned embodiment, it is possible to obtain a pattern with a stable finished shape on a wafer without depending excessively on the manufacturing device. As a result, it is possible to move to an early, stable mass production and increase yield quickly.

(4) Program

The aforementioned series of procedures of the parameter adjustment method may be implemented as a program to be executed by a computer; may be stored in a recording medium such as a flexible disk and a CD-ROM disk as a recipe file described above; and then may be read into the computer for execution. This allows the parameter adjustment method in accordance with the present invention to be provided by a general-purpose computer. The recording medium is not limited to a portable medium such as a magnetic disk and an optical disk, but a fixed recording medium such as a hard disk drive and a memory may be used. In addition, the program which incorporates the aforementioned series of procedures of the parameter adjustment method may be distributed through a communication line such as the Internet (including wireless communication). Further, the program which incorporates the aforementioned series of procedures of the parameter adjustment method may be encrypted, modulated, or compressed, and then, may be distributed through a wire line or a wireless line such as the Internet, or a recording medium containing the program may be distributed.

(5) Chip

If the aforementioned program is recorded in a very small recording medium such as a semiconductor memory, and such a recording medium is built in a portable chip (not shown), a manager can flexibly manage the production line by connecting the production management computer (not shown) and reading the recipe file from the chip when needed.

What is claimed is:

1. A parameter adjustment method for a plurality of manufacturing devices to form a pattern of a semiconductor device on a substrate using the manufacturing devices, the parameter adjustment method comprising:
   adjusting, by a computer, a parameter adjustable for a manufacturing device serving as a reference manufacturing device so as to fall within a range of a predetermined permissible variation and defining the adjusted parameter as a reference parameter of the reference manufacturing device;
   obtaining, by the computer, a first shape of a pattern of a semiconductor device to be formed on a substrate using the reference manufacturing device and a mask when the reference parameter is set for the reference manufacturing device and defining the obtained first shape as a reference finished shape;
   defining, by the computer, an adjustable parameter of another to-be-adjusted manufacturing device as a to-be-adjusted parameter of the to-be-adjusted manufacturing device;
   obtaining, by the computer, a second shape of the pattern formed on the substrate using the to-be-adjusted manufacturing device and the mask when the to-be-adjusted parameter is set for the to-be-adjusted manufacturing device and defining the obtained second shape as a to-be-adjusted finished shape;
   calculating, by the computer, a difference amount between the reference finished shape and the to-be-adjusted finished shape;
   comparing, by the computer, the calculated calculated with a predetermined reference value;
   outputting, by the computer, the to-be-adjusted parameter set for the to-be-adjusted manufacturing device as a parameter of the to-be-adjusted manufacturing device when the to-be-adjusted parameter resulting in the difference amount being equal to or less than the predetermined reference value; and
   repeatedly calculating, by the computer, the difference amount by changing the to-be-adjusted parameter until the difference amount becomes equal to or less than the predetermined reference value when the to-be-adjusted parameter resulting in the difference amount being more than the predetermined reference value and outputting, by the computer, as a parameter of the to-be-adjusted manufacturing device according to results obtained in the repeatedly calculating.

2. The parameter adjustment method according to claim 1, wherein the changing the to-be-adjusted parameter includes optimizing each factor of the to-be-adjusted parameter using an optimization algorithm.

3. The parameter adjustment method according to claim 2, wherein the changing the to-be-adjusted parameter includes predicting a combination of each factor of a to-be-adjusted parameter close to an optimum value using an experimental design method; and the optimizing each factor of the to-be-adjusted parameter is executed by the optimization algorithm using a value predicted by the experimental design method as an initial value.

4. The parameter adjustment method according to claim 2, wherein the optimization algorithm includes at least any one of a simplex method, a simulated annealing method and a genetic algorithm.

5. The parameter adjustment method according to claim 1, wherein the reference finished shape is defined with an uncontrollable variation in the reference manufacturing device being taken into consideration.

6. The parameter adjustment method according to claim 1, wherein the adjustable parameter includes at least any one of a light shape, an NA (numerical aperture), an aberration, a flare, a degree of polarization, a chromatic aberration, a scan, and a telecentric deflection.

7. The parameter adjustment method according to claim 1, wherein a manufacturing device includes a liquid immersion exposure device; and the adjustable parameter includes at least any one of a flow rate, a temperature, a refractive index, and a permeability of the exposure medium.

8. The parameter adjustment method according to claim 1, wherein an actually measured value is used as the reference parameter and the to-be-adjusted parameter.

9. The parameter adjustment method according to claim 1, wherein if there is a relative difference between a set value to a manufacturing device and an actually measured value, an offset amount with respect to the set value is considered as the reference parameter and the to-be-adjusted parameter.

10. The parameter adjustment method according to claim 1, wherein a manufacturing device which could manufacture a target product very well in a development stage is selected as the reference manufacturing device.

11. The parameter adjustment method according to claim 1, wherein the parameter is a degree of polarization; the difference amount is based on a difference in optical proximity effect; and the to-be-adjusted parameter is changed by changing the degree of polarization according to a degree of density/sparsity of the pattern.

12. The parameter adjustment method according to claim 11, wherein the pattern is a hole pattern disposed in a two-dimension so as to differ in the degree of density/sparsity between a vertical direction and a horizontal direction; and the degree of polarization is changed so as to make the horizontal-to-vertical ratio of a diameter of the hole pattern to be closer to 1.

13. A semiconductor device manufacturing method using a plurality of manufacturing devices whose parameters are adjusted and set by a parameter adjustment method, the parameter adjustment method comprising:
   adjusting, by a computer, a parameter adjustable for a manufacturing device serving as a reference manufacturing device so as to fall within a range of a predetermined permissible variation and defining the adjusted parameter as a reference parameter of the reference manufacturing device;
   obtaining, by the computer, a first shape of a pattern of a semiconductor device to be formed on a substrate using the reference manufacturing device and a mask when the reference parameter is set for the reference manufacturing device and defining the obtained first shape as a reference finished shape;

defining, by the computer, an adjustable parameter of another to-be-adjusted manufacturing device as a to-be-adjusted parameter of the to-be-adjusted manufacturing device;

obtaining, by the computer, a second shape of the pattern formed on the substrate using the to-be-adjusted manufacturing device and the mask when the to-be-adjusted parameter is set for the to-be-adjusted manufacturing device and defining the obtained second shape as a to-be-adjusted finished shape;

calculating, by the computer, a difference amount between the reference finished shape and the to-be-adjusted finished shape;

comparing, by the computer, the difference amount with a predetermined reference value;

outputting, by the computer, the to-be-adjusted parameter set for the to-be-adjusted manufacturing device as a parameter of the to-be-adjusted manufacturing device when the to-be-adjusted parameter resulting in the difference amount being equal to or less than the predetermined reference value; and repeatedly calculating, by the computer, the difference amount by changing the to-be-adjusted parameter until the difference amount becomes equal to or less than the predetermined reference value when the to-be-adjusted parameter resulting in the difference amount being more than the predetermined reference value and outputting, by the computer, as a parameter of the to-be-adjusted manufacturing device according to results obtained in the repeatedly calculating.

14. The semiconductor device manufacturing method according to claim 13,
wherein the changing the to-be-adjusted parameter includes optimizing each factor of the to-be-adjusted parameter using an optimization algorithm.

15. The semiconductor device manufacturing method according to claim 14,
wherein the changing the to-be-adjusted parameter includes predicting a combination of each factor of a to-be-adjusted parameter close to an optimum value using an experimental design method; and the optimizing each factor of the to-be-adjusted parameter is executed by the optimization algorithm using a value predicted by the experimental design method as an initial value.

16. The semiconductor device manufacturing method according to claim 13,
wherein the parameter is a degree of polarization; the difference amount is based on a difference in optical proximity effect; and the to-be-adjusted parameter is changed by changing the degree of polarization according to a degree of density/sparsity of the pattern.

17. A non-transitory computer-readable recording medium containing a program to cause a computer to execute a parameter adjustment method for a plurality of manufacturing devices to form a pattern of a semiconductor device on a substrate, the parameter adjustment method comprising:

adjusting a parameter adjustable for a manufacturing device serving as a reference manufacturing device so as to fall within a range of a predetermined permissible variation and defining the adjusted parameter as a reference parameter of the reference manufacturing device;

obtaining a first shape of a pattern of a semiconductor device to be formed on a substrate using the reference manufacturing device and a mask when the reference parameter is set for the reference manufacturing device and defining the obtained first shape as a reference finished shape;

defining an adjustable parameter of another to-be-adjusted manufacturing device as a to-be-adjusted parameter of the to-be-adjusted manufacturing device;

obtaining a second shape of the pattern formed on the substrate using the to-be-adjusted manufacturing device and the mask when the to-be-adjusted parameter is set for the to-be-adjusted manufacturing device and defining the obtained second shape as a to-be-adjusted finished shape;

calculating a difference amount between the reference finished shape and the to-be-adjusted finished shape;

comparing the difference amount with a predetermined reference value;

outputting the to-be-adjusted parameter set for the to-be-adjusted manufacturing device as a parameter of the to-be-adjusted manufacturing device when the to-be-adjusted parameter resulting in the difference amount being equal to or less than the predetermined reference value; and repeatedly calculating the difference amount by changing the to-be-adjusted parameter until the difference amount becomes equal to or less than the predetermined reference value when the to-be-adjusted parameter resulting in the difference amount being more than the predetermined reference value and outputting as a parameter of the to-be-adjusted manufacturing device according to results obtained in the repeatedly calculating.

18. The medium according to claim 17,
wherein the changing the to-be-adjusted parameter includes optimizing each factor of the to-be-adjusted parameter using an optimization algorithm.

19. The medium according to claim 18,
wherein the changing the to-be-adjusted parameter includes predicting a combination of each factor of a to-be-adjusted parameter close to an optimum value using an experimental design method; and the optimizing each factor of the to-be-adjusted parameter is executed by the optimization algorithm using a value predicted by the experimental design method as an initial value.

20. The medium according to claim 17,
wherein the parameter is a degree of polarization; the difference amount is based on a difference in optical proximity effect; and the to-be-adjusted parameter is changed by changing the degree of polarization according to a degree of density/sparsity of the pattern.

* * * * *